United States Patent [19]
Lake et al.

[11] Patent Number: 6,016,746
[45] Date of Patent: *Jan. 25, 2000

[54] FLIP CHIP SCREEN PRINTING METHOD

[75] Inventors: Rickie C. Lake, Eagle; Clay L. Cirino, Boise, both of Id.

[73] Assignee: Micron Communications, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/914,371

[22] Filed: Aug. 19, 1997

[51] Int. Cl.⁷ .................................................... B41M 1/12
[52] U.S. Cl. ........................................... 101/129; 101/123
[58] Field of Search .................................... 101/114, 116, 101/123, 129, 119, 120; 118/109, 213, 504

[56] References Cited

U.S. PATENT DOCUMENTS

| | | | |
|---|---|---|---|
| 3,565,039 | 2/1971 | Remer | 118/643 |
| 3,902,414 | 9/1975 | Zimmer et al. | 101/129 |
| 3,994,683 | 11/1976 | Zimmer et al. | 101/129 |
| 4,462,174 | 7/1984 | Messerschmitt | 38/102.1 |
| 4,606,966 | 8/1986 | Kohn | 101/120 |
| 4,909,145 | 3/1990 | Ericsson | 101/123 |
| 5,298,687 | 3/1994 | Rapoport et al. | 174/261 |
| 5,395,040 | 3/1995 | Holzmann | 118/58 |
| 5,407,488 | 4/1995 | Ray | 134/6 |
| 5,483,884 | 1/1996 | Vellanki | 101/123 |
| 5,537,920 | 7/1996 | Hasegawa et al. | 101/116 |

*Primary Examiner*—Ren Yan
*Attorney, Agent, or Firm*—Wells, St. John, Roberts, Gregory & Matkin P.S.

[57] ABSTRACT

Printing systems and processes are described. In a preferred implementation, a print system includes a platen, a print device and a print substance vibrator. A substrate upon which printing is desired is placed on the platen and the print device is placed operably adjacent thereto. A print substance is applied over the print device and through at least one perforation in the print device and onto the substrate. In one aspect, the print device comprises a screen and the print system is configured for screen printing. In another more preferred aspect, the print device comprises a stencil and the print system is configured for stencil printing. The print device and substrate are then separated from one another while a vibrative force is imparted to the print substance by the print substance vibrator. In a preferred implementation, the print substance vibrator comprises a transducer which is configured to impart vibrative force having a frequency greater than about 2000 Hz, and even more preferably in the ultrasonic range. The preferred transducer can be connected with or to one or more of the print device, the platen, and/or the substrate.

1 Claim, 5 Drawing Sheets

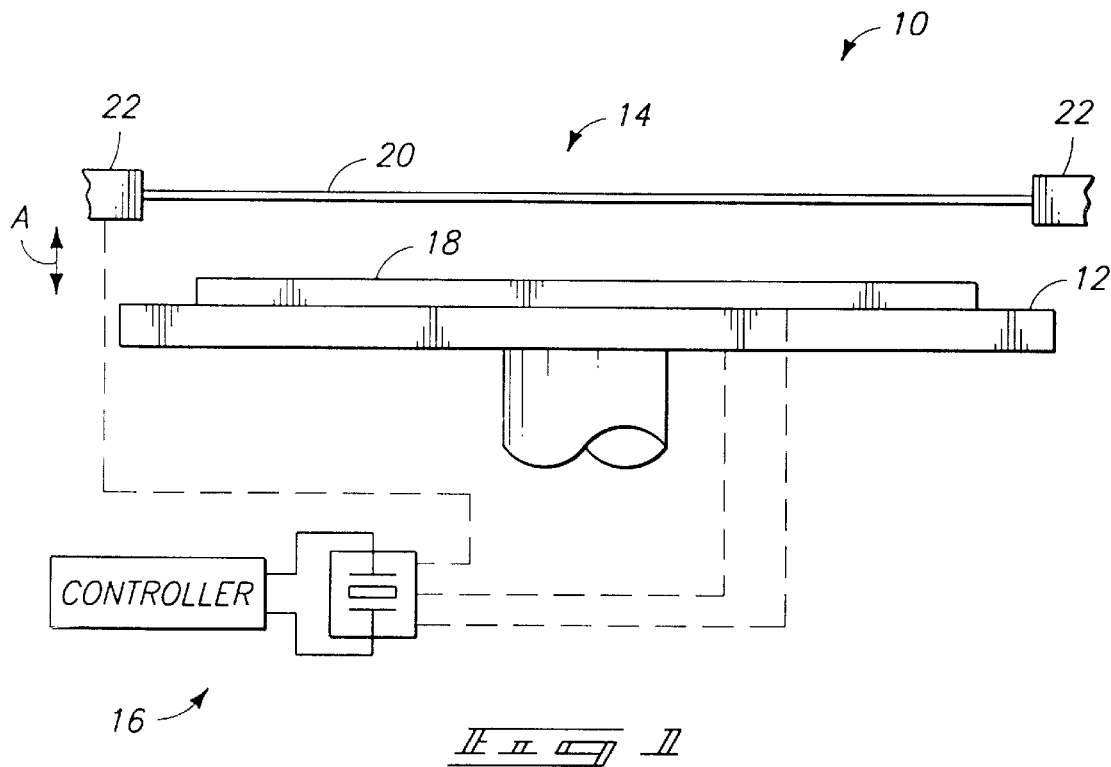
_Fig. 1_
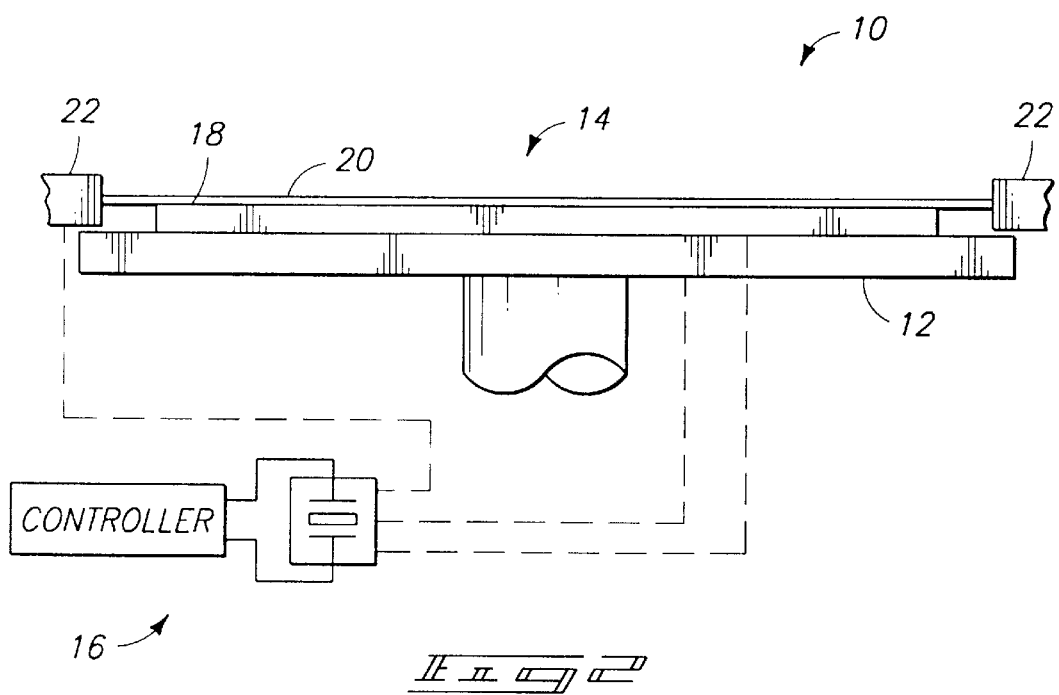
_Fig. 2_

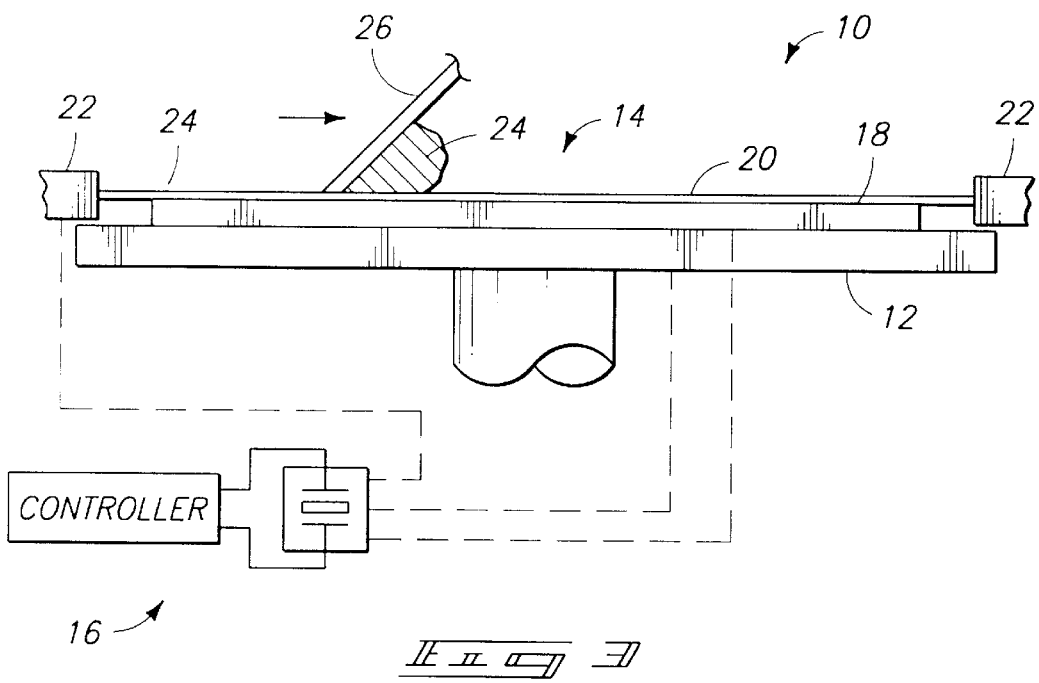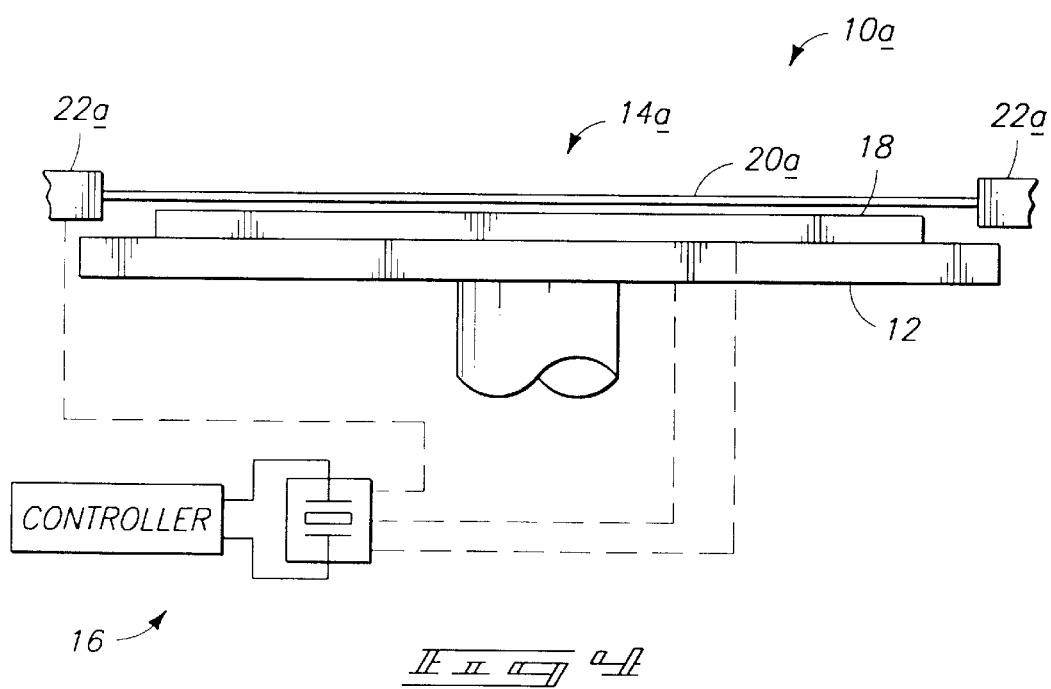

FLIP CHIP SCREEN PRINTING METHOD

TECHNICAL FIELD

This invention relates to printing systems and processes. More particularly, the invention relates to stencil and screen printing systems and processes.

BACKGROUND OF THE INVENTION

Printing systems such as stencil and screen printing systems find wide use within the electronics industry. Such systems are typically used to apply conductive print substances over a substrate, such as to form current carrying conductive interconnect lines on printed circuit boards. Such systems are also used in flip-chip bonding. Here, bumps of solder or other conductive material are deposited onto conductive pads of a semiconductor wafer or chip. After separation of individual dies from the wafer, the individual dies or chips are turned upside down, and the bumps are properly aligned with a metallization pattern on another substrate. The aligned bumps are then joined to appropriate points on the pattern.

One problem which is associated with such printing systems relates to an inability to achieve adequate print substance separation from its associated print system when a particular substrate is printed upon. An exemplary manifestation of this problem is in the context of flip chip bonding with a stencil printing system. A stencil printing system typically includes a stencil having number of perforations or apertures through which conductive material is provided to a substrate. The aspect ratio relative to such perforations, e.g., the thickness of the perforated print device immediately adjacent the perforation divided by the aperture opening size of the perforated print device, along with the physical characteristics of the print substance material, can affect the amount of material and the adequacy with which such material is formed onto a substrate. As an example, consider formation of conductive bumps having a height of around 7 mils and a width at the base of around 12 mils. Such would require a stencil having perforations with aspect ratios of no less than, and possibly greater than 0.58. Yet, such aspect ratios have been problematic in achieving adequate, standardized and repeatable flip chip bump configurations. This is believed to be due in part to the inability of the print substance to pull cleanly from the stencil apertures when the stencil is separated from the substrate.

This invention arose out of concerns associated with improving the methods and systems by which print substances are rendered onto substrates, and more particularly with enabling higher aspect ratio conductive features to be printed on substrates.

SUMMARY OF THE INVENTION

Printing systems and processes are described. In a preferred implementation, a print system includes a platen, a print device and a print substance vibrator. A substrate upon which printing is desired is placed on the platen and the print device is placed operably adjacent thereto. A print substance is applied over the print device and into at least one perforation in the print device and onto the substrate. In one aspect, the print device comprises a screen and the print system is configured for screen printing. In another more preferred aspect, the print device comprises a stencil and the print system is configured for stencil printing. The print device and substrate are then separated from one another while a vibrative force is imparted to the print substance by the print substance vibrator. In a preferred implementation, the print substance vibrator comprises a transducer which is configured to impart vibrative force having a frequency greater than about 2000 Hz, and even more preferably in the ultrasonic range. The preferred transducer can be connected with or to one or more of the print device, the platen, and/or the substrate.

BRIEF DESCRIPTION OF THE DRAWINGS

Preferred embodiments of the invention are described below with reference to the following accompanying drawings.

FIG. 1 is a diagrammatic view of one printing system in accordance with a preferred aspect of the invention, and depicts print processing in accordance with a preferred methodology of the present invention.

FIG. 2 is a view of the FIG. 1 system at a processing step subsequent to that shown in FIG. 1.

FIG. 3 is a view of the FIG. 1 system at a processing step subsequent to that shown in FIG. 2.

FIG. 4 is a diagrammatic view of another printing system in accordance with another preferred aspect of the invention, and depicts print processing in accordance with another preferred methodology of the present invention.

DETAILED DESCRIPTION OF THE PREFERRED EMBODIMENTS

Figure 5:
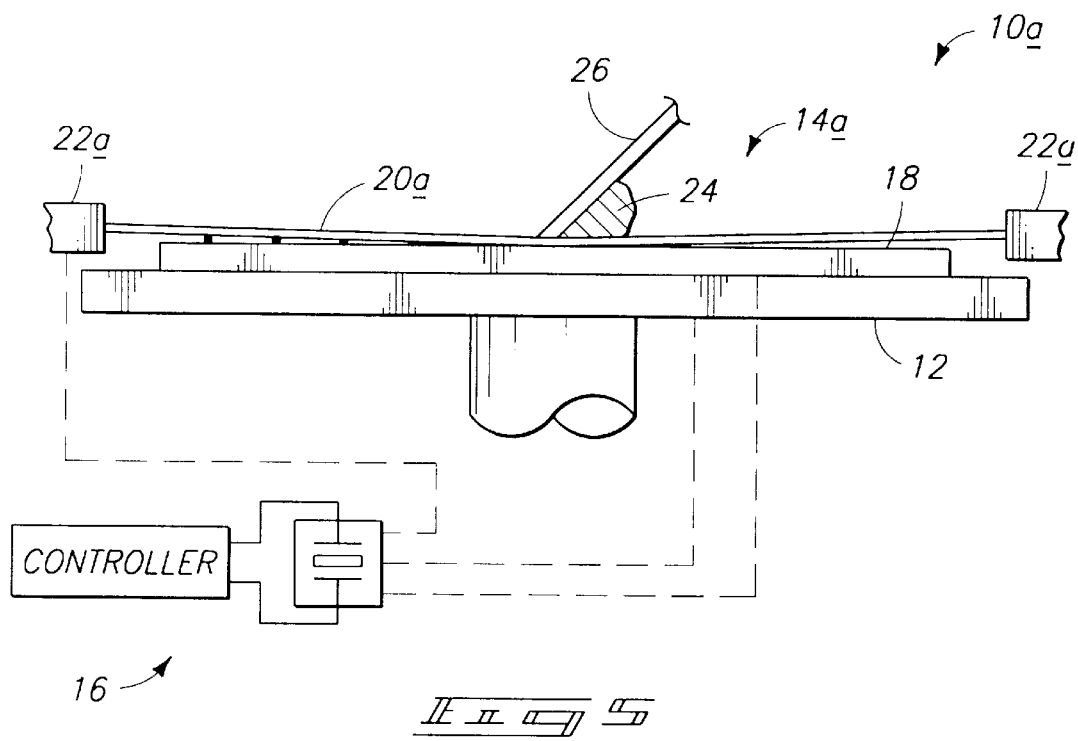
FIG. 5 is a view of the FIG. 4 system at a processing step subsequent to that shown in FIG. 4.

This disclosure of the invention is submitted in furtherance of the constitutional purposes of the U.S. Patent Laws "to promote the progress of science and useful arts" (Article 1, Section 8).

Referring to FIG. 1, a print system in accordance with a preferred embodiment of the invention is set forth generally at 10 and includes a platen 12, a print device 14, and a print substance vibrator 16. A substrate 18 is provided and can be placed upon platen 12 so that such can be printed upon as described below. Print device 14 includes a perforated or porous section 20 and a frame 22 which supports perforated section 20. In one aspect, perforated section 20 comprises a screen and system 10 is configured as a screen printing device. In another more preferred aspect, perforated section 20 comprises a stencil and system 10 is configured as a stencil printer. Perforated section 20 includes at least one and preferably more print perforations or apertures into and through which a print substance can be provided, as will be described in more detail below.

In the illustrated example, print device 14 is mounted operably proximate platen 12 and can be moved upwardly and downwardly, in the direction of arrow A, to bring the print device into an operative position so as to effect printing on substrate 18. It will be appreciated that either one, or both of print device 14 and platen 12 can be moved in the direction of arrow A to effectuate printing.

In a preferred embodiment, print substance vibrator 16 comprises a transducer which is configured to deliver a vibrative force to a print substance which is contained within or held by perforated section 20. Any suitable print substance can be utilized; and, an exemplary print substance is a silver-filled conductive polymer having a thixotropic index greater than or equal to about 2 to 2.5. A substance's thixotropic index is a measure of the substance's viscosity as a function of shear at a given temperature. The higher the index, the more sheer dependent the viscosity. Thus, the higher the index, the more impacting sheer or vibratory forces will be on reducing a substance's viscosity (and thus its resistance to flow). Accordingly, the vibrative force imparted by vibrator 16 enhances the ability of the print substance to pass or flow through the stencil or screen and onto a substrate as will become apparent below.

Vibrator 16 can be operably connected within system 10 to impart its vibrative force in a number of different ways. For example, vibrator 16 can be operably connected directly to frame 22 to deliver its force to the print substance through the frame. In such instance, the frame can serve as a medium through which the vibrative force passes before reaching the stencil/screen and print substance received therein. Vibrator 16 can also be connected to one or more of perforated section 20, platen 12, and substrate 18. Similarly, the perforated section, platen, and/or substrate can serve as a medium through which the vibrative force passes. In one implementation, vibrator 16 produces a vibrative force having a frequency greater than about 2,000 Hz. In another implementation vibrator 16 constitutes an ultrasonic transducer which is configured to deliver a vibrative force having a frequency in the ultrasonic range. Such normally constitutes frequencies between about 20 kHz to 40 kHz. In this case, ultrasonic waves would be generated and passed through one or more of the frame, perforated section, platen, and/or substrate to suitably vibrate the print substance and facilitate printing. Other manners of providing a desired degree of agitation relative to a print substance can be utilized, with vibrator 16 constituting but one preferred example. Accordingly, other frequencies which are greater or less than those discussed above could be utilized. For example, the print substance can be manually or mechanically vibrated as by shaking.

Referring to FIG. 2, print device 14 (perforated section 20) and substrate 18 are moved into physical contact with one another. Such can be accomplished by moving print device 14 downwardly from its spaced apart FIG. 1 position, by moving platen 12 upwardly from its FIG. 1 position, or both. Such constitutes a so-called "on-contact" printing configuration because at least one of the perforated section and the frame is in contact with the substrate prior to application of the print substance. Other printing configurations can however be used, with an exemplary one being described in connection with FIG. 4 below.

Referring to FIG. 3, a print substance 24 is applied over perforated section 20, into or through print device 14 and onto substrate 18. Print substance 24 can be applied over section 20 in any suitable manner. In this example, a squeegee-like device 26 is used to form a layer of print substance over perforated section 20. With the exemplary stencil, the squeegee-like device provides a suitable amount of downward pressure relative to the print substance to cause a desired amount of print substance to be formed into the stencil's individual perforations or apertures.

Referring to FIG. 4, an alternate embodiment is set forth generally at 10a. Like numerals from the first-described embodiment have been utilized where appropriate with differences being indicated by the suffix "a" or with different numerals. Such constitutes a print configuration which is not an "on-contact" configuration because perforated section 20a is not in contact with the substrate prior to application of a print substance. Accordingly, print device 14a is moved via frame 22a to a is position in which perforated section 20a is disposed above, and not in physical contact with substrate 18.

Referring to FIG. 5, print substance 24 is provided or applied over and into perforated section 20a via device 26. In so doing, device 26 deforms or deflects perforated section 20a toward substrate 18 until localized contact is achieved between the perforated section and the substrate. Accordingly, the print substance is brought into contact with substrate 18 through the deflection of the perforated section which, in turn, is caused by the application of print substance thereover.

Figure 6:
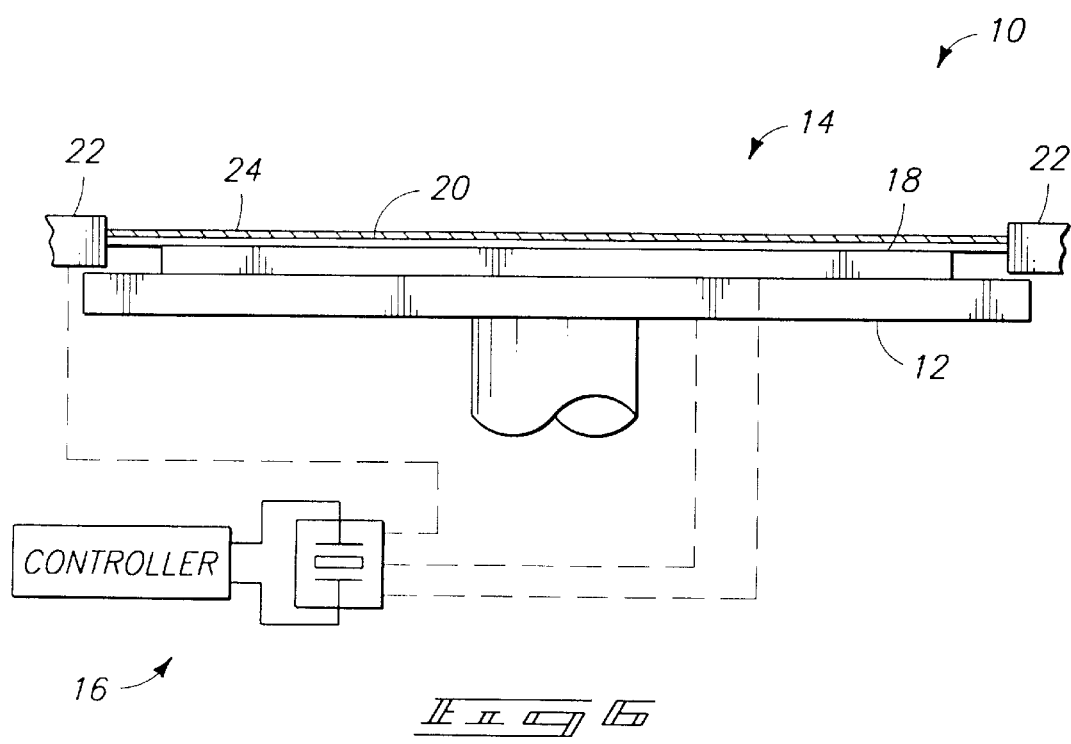
FIG. 6 is a view of the FIG. 1 system at a processing step subsequent to that shown in FIG. 3.

Referring to FIG. 6, subsequent processing is described with reference to the first-described embodiment. It will be understood, however, that subsequent processing with respect to the second-described embodiment can take place substantially as will be described. Such constitutes a point in processing where the print substance has been suitably applied over or into the perforated section. Preferably, the application of the print substance results in some physical contact between the print substance and the substrate. There may or may not be print substance disposed over perforated section 20 as shown.

Figure 7:
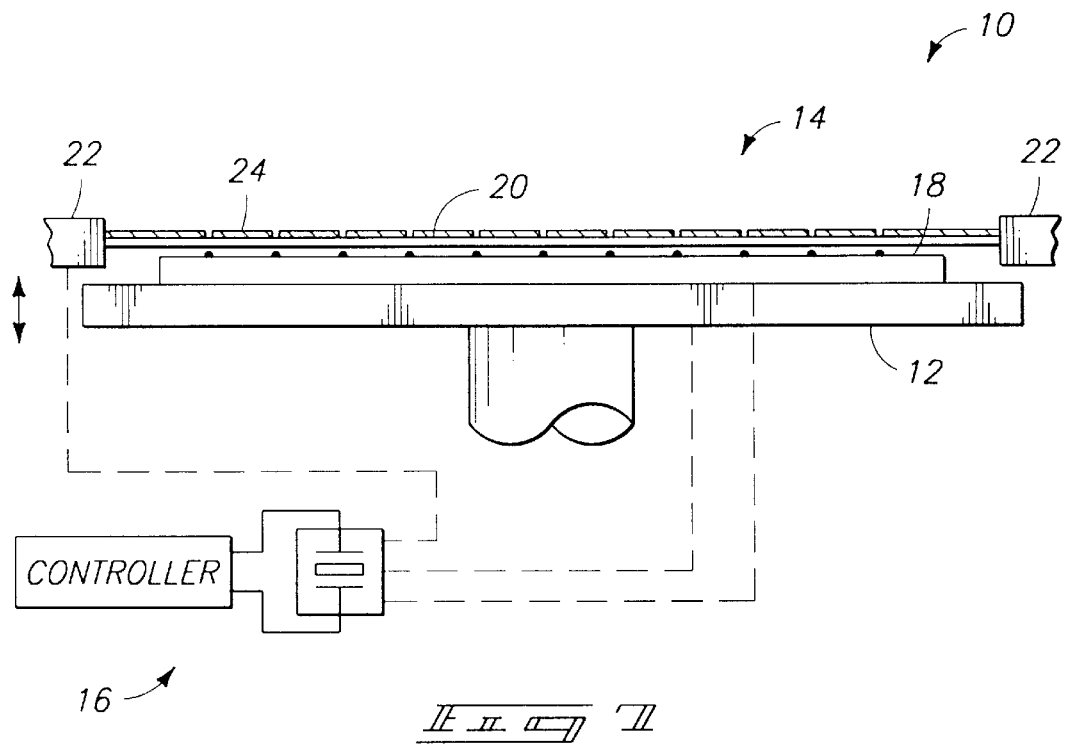
FIG. 7 is a view of the FIG. 1 system at a processing step subsequent to that shown in FIG. 6.

Referring to FIG. 7, print device 14 and substrate 18 are separated or moved away from one another while the print substance is vibrated or otherwise agitated by the print substance vibrator. Initiation of the vibration can take place, however, before separation of the print device and the substrate is initiated. For example, print substance vibrator 16 can initiate its vibrative force prior to, or during the above-described application of the print substance into the perforated section. Separation between the print device and the substrate can be achieved by moving the print device away from platen 12, by moving platen 12 away from print device 14, or both. As print substance vibrator 16 can be connected in any of the configurations mentioned above, e.g. to one or more of the frame, the platen, the substrate, and/or the perforated section, more vibrative force can be delivered to the print substance, and hence better flow rates achieved, than would otherwise occur if such vibrative force were not imparted to the print substance.

One advantage of utilizing the above-described printing system is most evident in the context of stencil printing. By virtue of the fact that vibrative force is preferably imparted to the print substance when it is received within the stencil, more of the print substance can be made to flow through individual stencil openings or apertures and onto the substrate. As a result, stencil openings or apertures can be formed to have higher aspect ratios than would otherwise be possible. Thus, more of a print substance having a narrower profile can be formed on a substrate.

Figure 8:
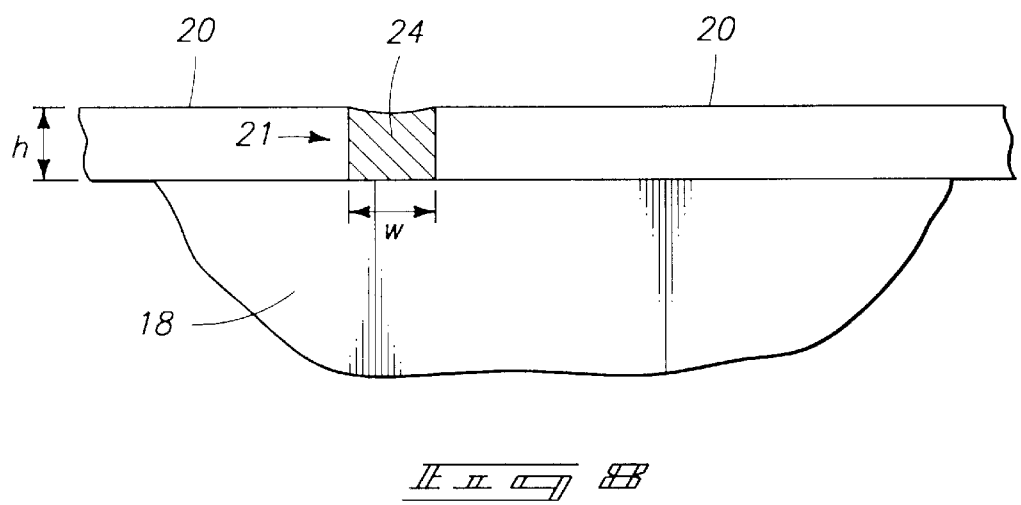
FIG. 8 is an enlarged view of a portion of the FIG. 1 system and corresponds to the processing step of FIG. 6.

Referring to FIG. 8, an enlarged portion of substrate 18 and print device 14 is shown. An exemplary print perforation or aperture 21 includes an amount of print substance 24, a portion of which is in contact with substrate 18. In a preferred implementation, perforation 21 has an aspect ratio greater than or equal to about 0.5. The term "aspect ratio" will be understood to comprise a ratio of a perforation height dimension h, to a perforation width dimension w.

Figure 9:
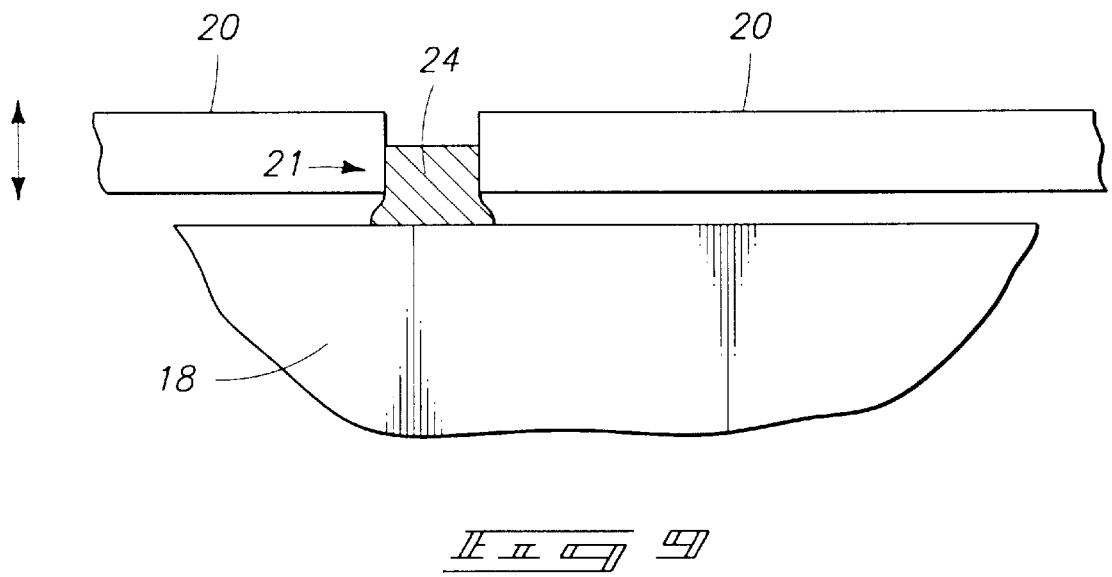
FIG. 9 is a view of the FIG. 8 system at a processing step subsequent to that shown in FIG. 8.

Referring to FIG. 9, a relative separation between print device 14 and substrate 18 is initiated with the above-described vibrative force being imparted to the print substance. Relatively clean dislodgement is achieved as between the illustrated print substance and the sidewalls of stencil perforation 21.

Figure 10:
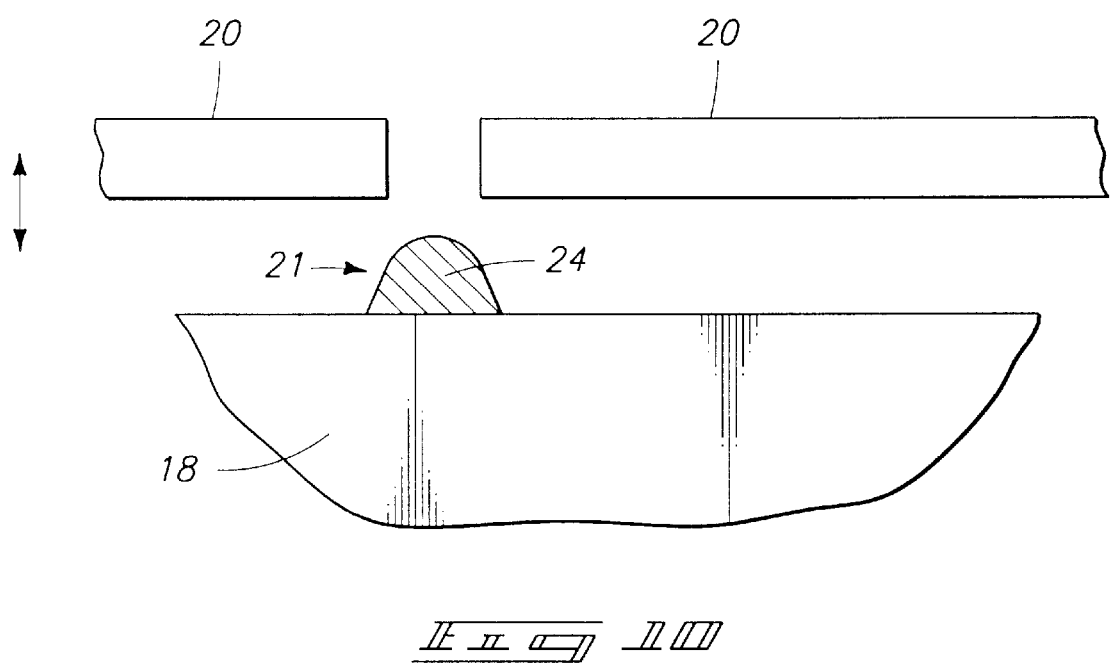
FIG. 10 is a view of the FIG. 8 system at a processing step subsequent to that shown in FIG. 9.

Referring to FIG. 10, complete separation between the print device and the deposited print substance is achieved with little or no remnant print substance being left over the sidewalls of the stencil perforation. Such desirably provides a generally uniform and rounded bump of conductive material over the substrate.

The invention is particularly useful in the context of flip chip bonding with stencil printing systems. It will be appreciated, however, that the invented systems and methods are useful in other print regimes such as, by way of example only, with solder paste deposition onto printed wiring boards.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed:

1. A flip chip bumping process comprising:

providing a flip chip comprising a plurality of conductive pads;

providing a stencil over the flip chip, the stencil having a frame and openings, at least some of the openings having aspect ratios of greater than or equal to about 0.5;

applying a conductive material having a thixotropic index of at least about 2 onto the stencil and through the openings onto the conductive pads of the flip chip, the flip chip being generally fixed in position during at least some of the applying of the conductive material; and after said applying and in a processing step discrete from said applying, moving at least one of the stencil and the flip chip away from the other while contemporaneously ultrasonically vibrating the stencil frame to vibrate the conductive material effective to leave bumps of conductive material at least some of which have aspect ratios of greater than or equal to about 0.5 over the conductive pads.

* * * * *

UNITED STATES PATENT AND TRADEMARK OFFICE
CERTIFICATE OF CORRECTION

PATENT NO : 6,016,746
DATED : January 25, 2000
INVENTOR(S) : Rickie C. Lake et al.

It is certified that error appears in the above-identified patent and that said Letters Patent are hereby corrected as shown below:

Col. 4, line 6
 replace "is"
 with --delete--.

Signed and Sealed this

Third Day of April, 2001

Attest:

NICHOLAS P. GODICI

Attesting Officer     Acting Director of the United States Patent and Trademark Office